(12) United States Patent
Huang et al.

(10) Patent No.: US 8,179,205 B2
(45) Date of Patent: May 15, 2012

(54) LINEARIZATION SYSTEMS AND METHODS FOR VARIABLE ATTENUATORS

(75) Inventors: Yanyu Huang, Atlanta, GA (US); Wangmyong Woo, Cumming, GA (US); Chang-Ho Lee, Marietta, GA (US); Joy Laskar, Marietta, GA (US)

(73) Assignee: Samsung Electro-Mechanics, Gyunngi-Do (KR)

( * ) Notice: Subject to any disclaimer, the term of this patent is extended or adjusted under 35 U.S.C. 154(b) by 181 days.

(21) Appl. No.: 12/784,723

(22) Filed: May 21, 2010

(65) Prior Publication Data
US 2011/0285481 A1    Nov. 24, 2011

(51) Int. Cl.
*H01P 1/22* (2006.01)
(52) U.S. Cl. ...................... 333/81 R; 327/308
(58) Field of Classification Search .............. 333/81 R, 333/81 A; 327/308, 309, 310, 311, 312, 327/316
See application file for complete search history.

(56) References Cited

U.S. PATENT DOCUMENTS

| | | | | |
|---|---|---|---|---|
| 4,523,161 A | * | 6/1985 | Miles | 333/81 R |
| 4,890,077 A | * | 12/1989 | Sun | 333/81 A |
| 7,286,001 B2 | * | 10/2007 | Nakatsuka et al. | 327/308 |

* cited by examiner

*Primary Examiner* — Stephen Jones

(57) ABSTRACT

Systems and methods for provided for linearization systems and methods for variable attenuators. The variable attenuators can include series transistors along a main signal path from the input to output, as well as shunt transistors. A bootstrapping body bias circuit can be used with one or of the series transistors to allow the body of a connected transistor to swing responsive to a received RF input signal. As the RF signal increases and affects the gate-to-source voltage difference of a transistor, a bootstrapping body bias circuit can adaptively adjust the threshold voltage of the connected transistor and compensate the channel resistance variation resulting from gate-to-source voltage swing. The bootstrapping body bias circuit can be implemented using passive elements, active elements, or a combination thereof.

20 Claims, 4 Drawing Sheets

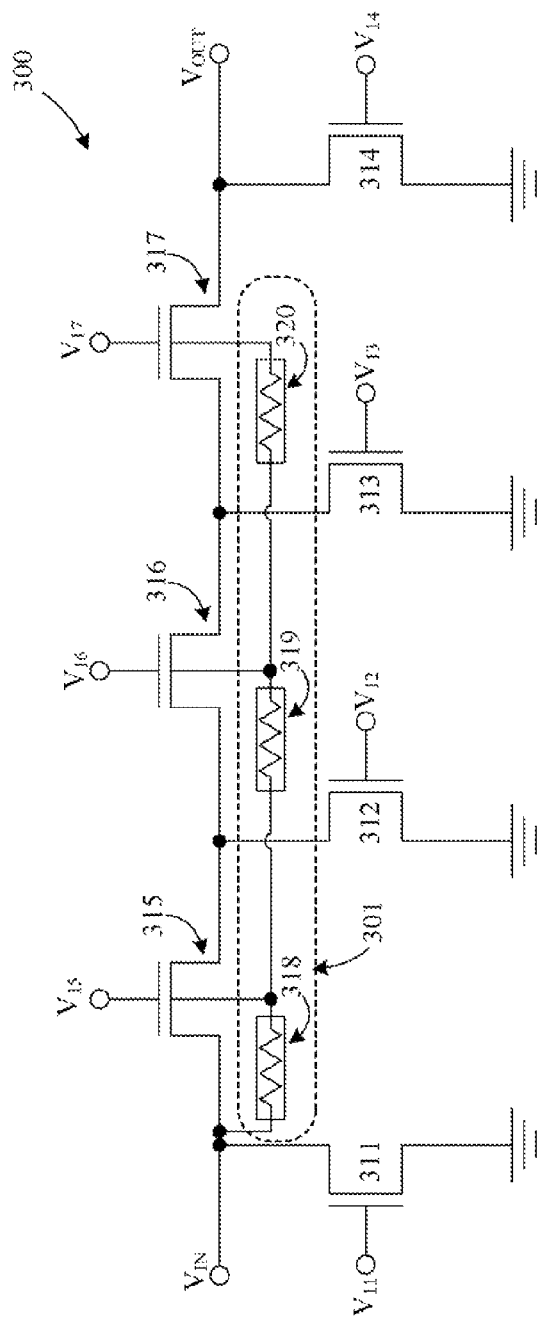
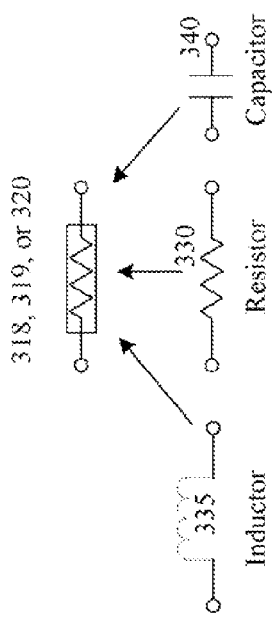
FIG. 3A
FIG. 3B

LINEARIZATION SYSTEMS AND METHODS FOR VARIABLE ATTENUATORS

FIELD OF THE INVENTION

Embodiments of the invention relates to generally to variable gain attenuators, and more specifically to variable gain attenuators utilizing transistors and bootstrapping body bias circuits to support higher power handling capabilities.

BACKGROUND OF THE INVENTION

Signal strength control of a system usually requires a variable gain/attenuation element. A variable attenuator is desirable in situations that need to handle higher amount of power.

Passive elements in an variable attenuator may grouped into two kinds—(i) one includes series elements that connect parallel to the direction of the input terminal to output terminal, and (ii) the second includes shunt elements that connect from the input, the output, or the intersection points of two series elements to the ground (earth).

An attenuator may have lower attenuation when its series elements have smaller impedance and its shunt elements have higher impedance. At such a setting, the input signal may be isolated from ground by high impedance shunt elements and traveling through low impedance series elements from input to output. On the other hand, an attenuator may have higher attenuation when its series elements have larger impedance and its shunt elements have lower impedance. At such setting, the input signal may be diverted to ground through low impedance shunt elements, and only a small portion of input signal may travel through the high impedance series elements to the output.

MOSFETs can be used in a conventional configuration to provide tunable passive elements in an attenuator. However, the impedance of a MOSFET varies significantly with the strength of input signals it carries, thereby degrade its gain linearity. Thus, there is a need for linearization systems and methods for variable attenuators.

SUMMARY OF THE INVENTION

Some or all of the above needs and/or problems may be addressed by certain embodiments of the invention. Embodiments of the invention may include linearization systems and methods for variable attenuators.

Example embodiments of the invention may provide an example bootstrapping body bias for one or a plurality of transistors in a variable attenuator. The transistors may be metal-oxide-semiconductor field-effect transistor (MOSFETs). In accordance with an example bootstrapping body bias, the channel resistance variation of a connected transistor may be alleviated by manipulating the body effect, and the gain linearity of the variable attenuator may be improved.

According to an example embodiment of the invention, one or more example bootstrapping body bias circuits may be utilized for bootstrapping the body voltage to an input. These example passive circuits may include one or more resistors, inductors, capacitors, transistors, or various combinations thereof. If the transistors are applied, they may serve as variable impedance elements or variable resistance elements. Further, these passive circuit may connect from the source or drain terminal of a transistor to its body terminal; or in a variable attenuator circuit with a plurality of transistors, there may be multiple passive circuits that connect the body terminal of one or a plurality of transistor to any terminal of any other transistor in the variable attenuator, according to an example embodiment of the invention.

BRIEF DESCRIPTION OF THE DRAWINGS

Figure 1:
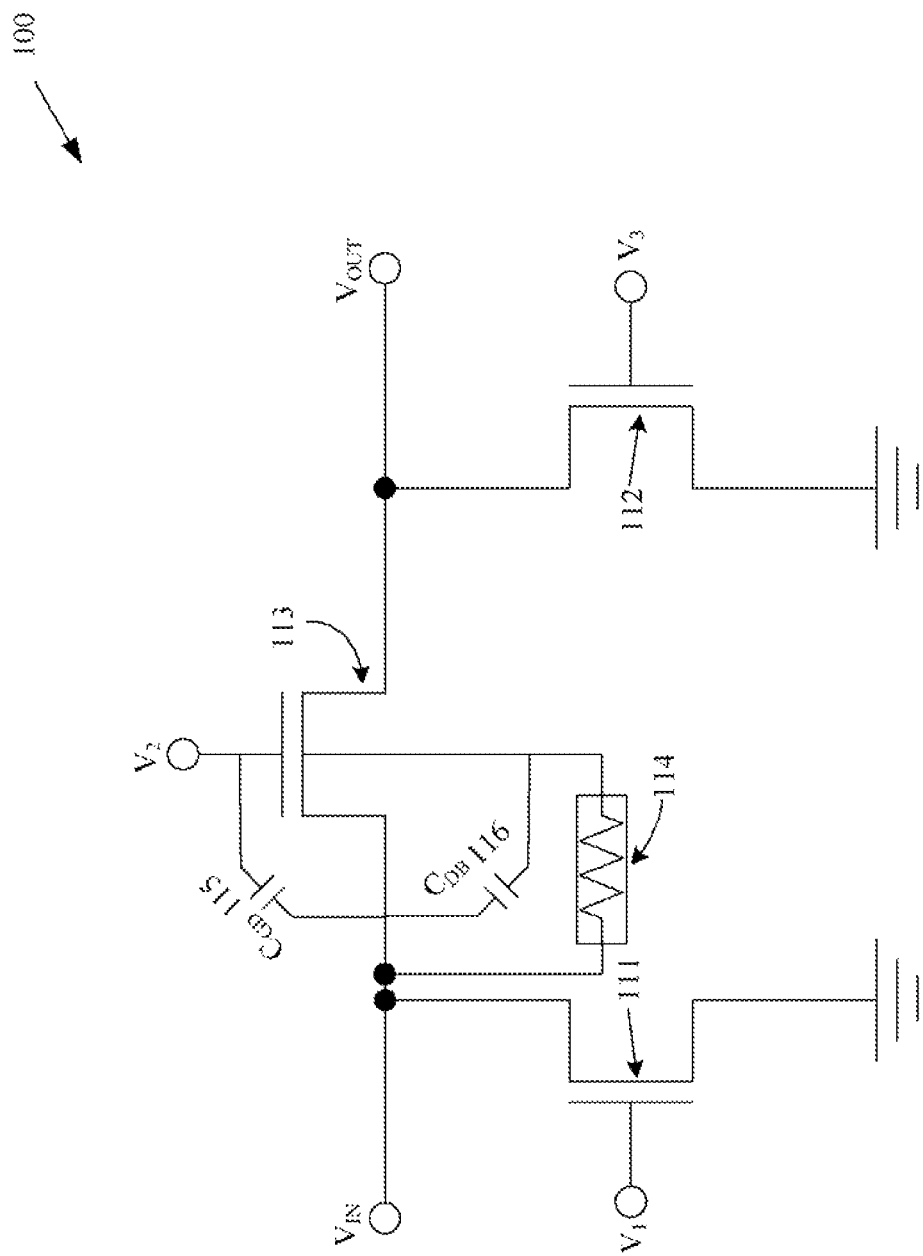

Having thus described the invention in general terms, reference will be now made to the accompanying drawings, which are not necessarily drawn to scale, and wherein:

FIG. 1 illustrates an example bootstrapping body biased transistor of a single-stage variable attenuator in accordance with an example embodiment of the invention.

Figure 2A:
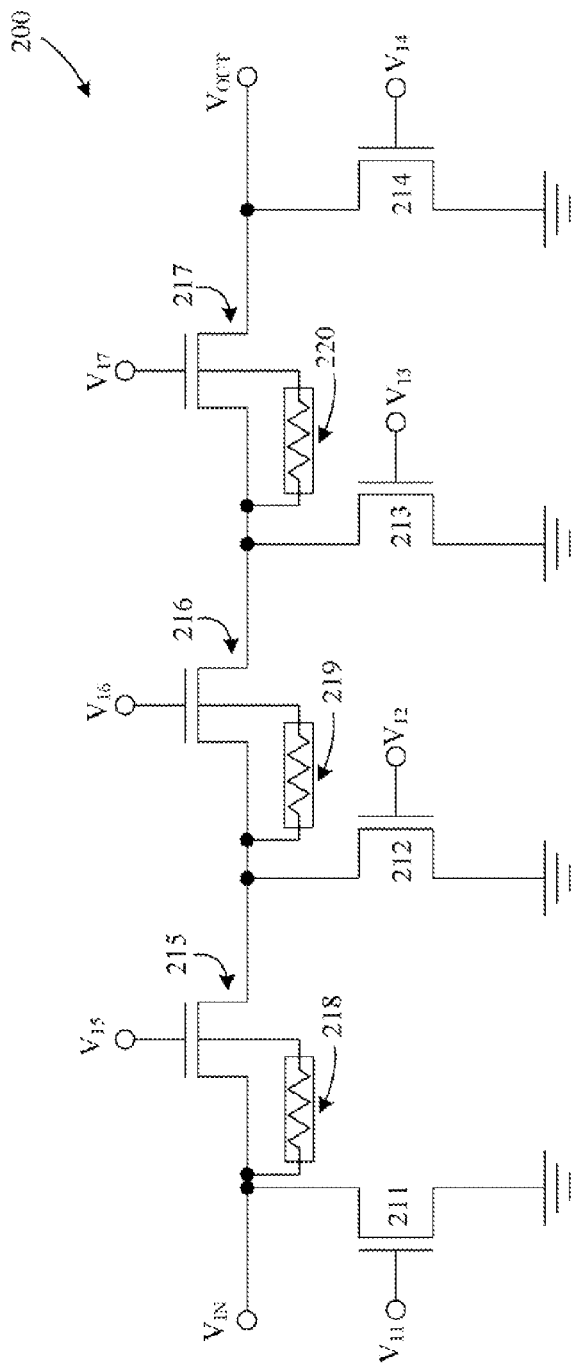

FIG. 2A illustrates an example bootstrapping body biased multiple-stage attenuator circuit, according to an example embodiment of the invention.

Figure 2B:
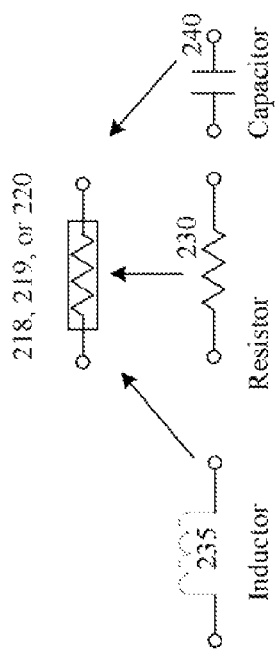

FIG. 2B illustrates an example implementation for a bootstrapped body bias circuit, according to an example embodiment of the invention.

FIG. 3A illustrates another example bootstrapping body biased multiple-stage attenuator circuit, according to an example embodiment of the invention.

FIG. 3B illustrates an example implementation for a bootstrapped body bias circuit, according to an example embodiment of the invention.

Figure 4A:
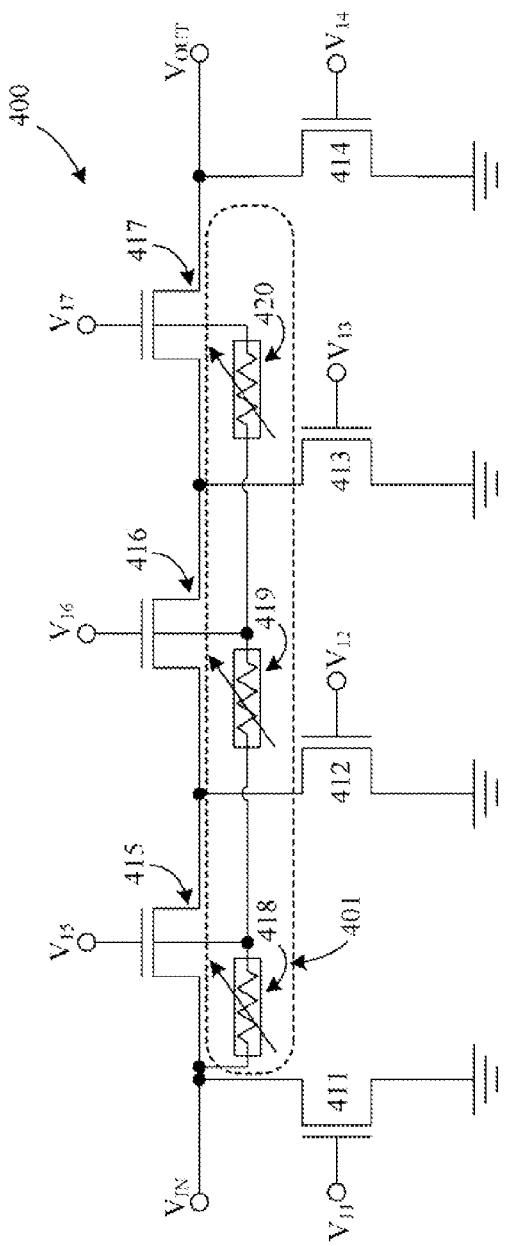

FIG. 4A illustrates an example variable attenuator in which an example bootstrapping body bias network includes tunable elements or components.

Figure 4B:
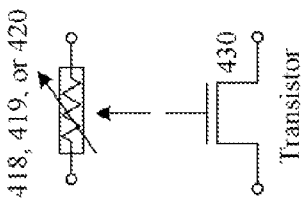

FIG. 4B illustrates an example transistor utilized as a variable resistance element for a bootstrapped body bias circuit, according to an example embodiment of the invention.

DETAILED DESCRIPTION OF THE INVENTION

Example embodiments of the invention will now be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Embodiments of the invention may be directed to variable attenuators using one or more series transistors and shunt transistors to provide variable impedances. These transistors can include MOSFETs, according to an example embodiment of the invention. Additionally, bootstrapping body bias circuits can be provided for one or more of the series transistors in the series path from the input to output of the variable attenuator to alleviate the channel resistance variation of a series transistor, thereby improving the gain linearity of the variable attenuator.

More specifically, the bootstrapping bias circuit may generate an adaptive output signal to the body terminal of a connected transistor in a variable attenuator circuit responsive to the input signal voltage swing received by the transistor in the variable attenuator circuit. As the input signals that travel through the transistor rise or fall, the bootstrapping bias circuit may increase or decrease the bias voltage to the body terminal of the transistor; thus, the body voltage may be biased with reference to the input signal and may be able to increase or decrease the threshold voltage of the transistor through a body effect. In this way, the channel resistance of the transistor affected by the voltage swing between the gate and the source may be compensated by an adaptive threshold voltage in accordance with the bias voltage from the bootstrapping bias circuit. Thus, the input-signal-caused impedance variation of transistor in a variable attenuator may be reduced, and the gain linearity of the variable attenuator may be improved.

FIG. 1 illustrates an example single-stage π-shaped variable attenuator 100 with bootstrapping body biased transistor, according to an example embodiment of the invention. In particular, the variable attenuator 100 may include transistors 111, 112, 113, which may be implemented using MOSFETs, according to an example embodiment of the invention. Each of the transistors 111, 112, 113 may operate as tunable elements in which the associated channel resistances (e.g., drain-to-source or source-to-drain resistances) may be varied, perhaps by adjusting the control signals $V_1$, $V_2$, $V_3$ (e.g., DC bias signals) provided to the respective gate terminals, according to an example embodiment of the invention.

As configured, a first terminal (e.g., drain terminal) of shunt transistor 111 may be connected to the input terminal ($V_{IN}$) of the attenuator 100 while the second terminal (e.g., source terminal) of shunt transistor 111 may be connected to ground (GND). Likewise, the first terminal (e.g., drain terminal) of shunt transistor 112 may be connected to the output terminal ($V_{OUT}$) of the attenuator 100 while the second terminal (e.g., source terminal) of shunt transistor 112 may be connected to ground (GND). In addition, the first terminal (e.g., drain terminal) of transistor 113 in the main signal path may be connected to the input terminal ($V_{IN}$) of the attenuator 100 while the second terminal (e.g., source terminal) of the transistor 113 may be connected to the output terminal ($V_{OUT}$) of the attenuator 100. It will be appreciated that the input terminal ($V_{IN}$) may be where a signal is inputted to the attenuator 100, and output terminal ($V_{OUT}$) may be where an attenuated signal is outputted from the attenuator 100.

In accordance with an example embodiment, an example signal bootstrapping body bias circuit 114 can be utilized for transistor 113. More specifically, the bootstrapping body bias circuit 114 have one end connected to the first terminal (e.g., drain terminal) of the transistor 113, and an other end of the circuit 114 connected to the body terminal of transistor 113, which is also connected to the input terminal ($V_{IN}$). An example bootstrapping body bias circuit 114 may include a resistor, an inductor, a capacitor, or a combination thereof in parallel or series. In addition or in the alternative, the example bootstrapping body bias circuit 114 may also include one or more transistors that can operate as a variable impedance element.

It will be appreciated that while FIG. 1 illustrates a π-shaped variable attenuator 100, the bootstrapping body bias circuit 114 can also be applied to a T or bridged-T variable attenuator, or a hybrid thereof, without departing from example embodiments of the invention. Likewise, it will be appreciated that the respective first and second terminals of the transistors 111, 112, 113 may be either drain terminals or source terminals, or vice versa, without departing from example embodiments of the invention. Indeed, because the source and drain terminals of a MOSFET may be symmetric in physical layout, the port that is closer to the input terminal ($V_{IN}$), whether a source terminal or a drain terminal, may be the first terminal while the opposite terminal may be the second terminal, according to an example embodiment of the invention. Likewise, changing of the order of the drain and source terminals of a MOSFET may not affect the operation of an example variable attenuator in accordance with an example embodiment of the invention. Further, while each of transistors 111-113 have been illustrated as a single transistor, one or more of the transistors 111-113 may actually comprise a plurality of transistors in parallel, where the respective drain terminals are connected together and the respective source terminals are connected together. Alternatively, one or more of the transistors 111-113 could also comprise a plurality of transistors in series without departing from example embodiments of the invention.

Still referring to FIG. 1, during operation of the variable attenuator 100, a RF input signal may be fed to the input terminal ($V_{IN}$), and the output terminal ($V_{OUT}$) can output an attenuated RF signal that is generated based upon the input signal and the respective control signals (e.g., $V_1$, $V_2$, $V_3$) at the respective gate terminals of the transistors 111, 112, 113. The attenuation of the output signal, as compared to the input signal, may be determined by the amount of impedance provided between the input terminal ($V_{IN}$) and output terminal ($V_{OUT}$), which may be based upon (i) a first impedance provided by a channel resistance of transistor 113, (ii) a second impedance from the input terminal ($V_{IN}$) to ground that is provided by the channel resistance of transistor 111, and (iii) a third impedance form the output terminal ($V_{OUT}$) to ground that is provided by the channel resistance of f transistor 112.

When a RF input signal is applied to the variable attenuator 100, the voltage swing at the input terminal ($V_{IN}$) may be coupled to other terminals of transistor 113 through parasitic capacitors such as gate-to-drain parasitic capacitance $C_{GD}$ 115 and drain-to-body parasitic capacitance $C_{DB}$ 116. The coupled RF signal at the gate terminal of transistor 113 may add to the original control signal $V_1$ (e.g., a DC bias signal), and therefore the gate-to-source voltage $V_{GS}$ may change with the input voltage swing, as does the channel resistance of transistor 113. Without the benefit of a bootstrapping body bias circuit 114, at certain bias point, the coupled voltage at the gate of transistor 113 may generate a large enough gate-to-source voltage $V_{GS}$ difference and thus generate a significant $V_{GS}$-$V_{TH}$ voltage difference to reduce or increase the channel resistance of transistor 113 significantly. The reduction or increase of the channel resistance of the transistor 113 may reduce or increase the amount of signal that passes through the channel and therefore changes the gain of the attenuator 100. Since the gain could vary with input signal strength, the attenuator 100 could appear to be a non-linear gain response over different input signal strength if the bootstrapping body bias circuit 114 is not utilized.

To help minimize the fluctuations of the channel resistance of transistor 113 based upon the input signal strength, a bootstrapping body bias circuit 114 can connect a drain terminal (or alternatively, a source terminal) of transistor 113 to the body terminal of the transistor 113. The bootstrapping body bias circuit 114 may be operative to control the body voltage swing of the transistor 113 so that the body voltage swing moves with the gate voltage swing based upon the input signal strength. Accordingly, when the voltage swings at the drain terminal of transistor 113 increases, the gate-to-source voltage $V_{GS}$ likewise increases. However, the bootstrapping body bias circuit 114 may likewise increase the source-to-body voltage $V_{SB}$ swing with the drain voltage level, and a resulting body effect can increase the threshold voltage $V_{TH}$, thereby reducing the $V_{GS}$-$V_{TH}$ voltage difference, and helping to maintain the channel resistance of the transistor 113. In comparison to a conventional attenuator, the utilization of a bootstrapping body bias circuit 114 may couple a larger amount of signal swing to the body terminal of transistor 113 than which is possible only with parasitic capacitance $C_{DB}$ 116. Thus, the utilization of the bootstrapping body bias circuit 114 may enforce the threshold voltage $V_{TH}$ of transistor 113 to move closely with the RF input signal of attenuator 100.

Two particular examples will now be illustrated to describe the operations of attenuator 100 when a rising RF input signal is applied, and when a falling RF input signal is applied, to the input terminal ($V_{IN}$) of a variable attenuator 100, according to an example embodiment of the invention. First, when a rising RF input signal is applied to the input terminal ($V_{IN}$), the gate voltage and the gate-to-source voltage $V_{GS}$ of transistor 113 may increase with the rising RF input signals, and as a result, the $V_{GS}$-$V_{TH}$ voltage difference may increase and cause reductions of the channel resistance of transistor 113. By utilizing the bootstrapping body bias circuit 114, the body bias may rise with the input RF signal, thereby increasing the threshold voltage $V_{TH}$ of the transistor 113. Accordingly, the $V_{GS}$-$V_{TH}$ voltage difference of transistor 113 may remain relatively constant, as well as the channel resistance of transistor 113 and gain of the variable attenuator 300.

On the other hand, when a falling RF signal is applied to the input terminal ($V_{IN}$), the gate voltage and the gate-to-source voltage $V_{GS}$ of transistor 113 may drop with the falling RF input signal, and as a result, the $V_{GS}$-$V_{TH}$ voltage difference may drop. This initially may cause the augmentation of channel resistance of transistor 113, but the bootstrapping body bias circuit 114 may concurrently decrease the source-to-body voltage $V_{SB}$ of transistor 113. In this way, the threshold voltage $V_{TH}$ of transistor 113 may decrease and maintain the $V_{GS}$-$V_{TH}$ voltage difference of transistor 113 at a relatively constant level. Accordingly, the channel resistance of transistor 113, as well as the gain of variable attenuator 100, may remain relatively constant.

FIG. 2A illustrates a variation of the example variable attenuator 200 with an example bootstrapping body bias circuit, according to an example embodiment of the invention. In particular, the example variable attenuator 200 of FIG. 2A may include a plurality of single-stage variable attenuators cascaded together, where each variable attenuator stage may be similar to that described with respect to FIG. 1. For example, a first single-stage π-shaped variable attenuator may be defined by transistors 211, 212, 215. Likewise, a second single-stage π-shaped variable attenuator may be defined by transistors 212, 213, 216. Finally, a third second single-stage π-shaped variable attenuator may be defined by transistors 213, 214 and 217. Among these three stages of attenuators, transistor 212 may be shared by the first and second single-stage attenuators, while transistor 213 may be shared by the second and third single-stage attenuators, according to an example embodiment of the invention.

As shown in FIG. 2A, shunt transistor 211 may be connected from an intersection of the input terminal ($V_{IN}$) and the drain terminal of transistor 215 to ground; shunt transistor 212 may be connected from an intersection of the source terminal of transistor 215 and the drain terminal of transistor 216 to ground; shunt transistor 213 may be connected from an intersection of the source terminal of transistor 216 and the drain terminal of transistor 217 to ground; and shunt transistor 214 may be connected from an intersection of the source terminal of transistor 217 and the output terminal ($V_{OUT}$) to ground. Further, series transistors 215, 216, and 217 in the variable attenuator 200 may be connected in series in the main signal path from source terminal to drain terminal, according to an example embodiment of the invention. The input terminal ($V_{IN}$) may allow a RF input signal to be input to the variable attenuator 200, and the output terminal ($V_{OUT}$) may provide the attenuated RF signal output for the variable attenuator 200.

It will be appreciated that transistors 211-217 may be implemented as respective MOSFETs in accordance with an example embodiment of the invention. It will also be appreciated that while each of transistors 211-217 have been illustrated as a single transistor, one or more of the transistors 211-217 may actually comprise a plurality of transistors in parallel (or alternatively, in series), where the respective drain terminals are connected together and the respective source terminals are connected together. For example, transistor 212 may represent all MOSFETs that in parallel and that are connected from the interconnection point of transistors 215, 216 to ground, while transistor 213 may represent all MOSFETs that in parallel and that are connected from the interconnection point of transistor 216 and 217 to ground. Likewise, it will be appreciated that the positions of the sources and drains of the transistors 211-217 in FIG. 2A can be reversed without departing from example embodiments of the invention.

FIG. 2A also illustrates bootstrapping body bias circuits 218, 219, 220. Body bias circuit 218 can be connected from the drain terminal (or source terminal) of transistor 215 to the body terminal of transistor 215. Likewise, the body bias circuit 219 can be connected from the drain terminal (or source terminal) of transistor 216 to the body terminal of transistor 216. In addition, the body bias circuit 220 can be connected from the drain terminal (or source terminal) of transistor 217 to the body terminal of transistor 217. As illustrated in FIG. 2B, each body bias circuit 218, 219, 220 may comprise one or more of a resistor 230, an inductor 235, or a capacitor 240. It will be appreciated that in variable attenuator circuit 200, the body bias circuits 218-220 may maximally enforce the body voltage of transistors 215-217 to be infinitely close to but still smaller than the drain voltage of transistors 215 to 217 when the body bias circuit 218-220 are all comprised of passive circuits (e.g., a resistor 230, an inductor 235, a capacitor 240) that have no gain.

Still referring to FIG. 2A, the bootstrapping body biasing circuit 218, 219, 220 may generate adaptive output signals to a respective body terminal of a respective transistor 215, 216, 217 for the variable attenuator 200 according to the voltage swing at the drain terminal (or alternatively, the source terminal) of each transistor 215, 216, 217. The attenuation of the output signal at the output terminal ($V_{OUT}$) of the example attenuator 200 may be determined by the respective channel resistances of transistors 211-217. To operate the variable attenuator 200 in a low attenuation setting, the gate control voltages $V_{11}$-$V_{14}$ of respective transistors 211-214 may set to be relatively low bias voltage, and the respective channel resistances of transistors 211-214 may be relatively high to prevent the RF signal that feeds to the input terminal ($V_{IN}$) from being diverted to ground through transistors 211-217 on the way to the output terminal ($V_{OUT}$). Likewise, the gate voltage $V_{15}$-$V_{17}$ for respective transistors 215-217 may set to be a relatively high bias voltage, and the channel resistance of respective transistors 211-214 may be relatively low so that a large portion of the RF signal that feeds to the input terminal ($V_{IN}$) may propagate along the main signal path to output terminal ($V_{OUT}$).

During operation, the RF signal may feed to the input terminal ($V_{IN}$), and may pass through the drain-to-source channel of transistors 215-217, and to the output terminal ($V_{OUT}$). The RF signal that appears in the respective drain terminals of transistors 215-217 may be coupled to the gate terminal of transistor 215 to 217 through the parasitic capacitance $C_{GD}$ of transistors 215-217 respectively. The respective coupled RF signal at the respective gate terminal of each transistor 215-217 may add to the respective original control signal $V_{15}$-$V_{17}$, and therefore the respective gate-to-source voltage $V_{GS}$ of each transistor 215-217 may change with the input voltage swing, as does the respective channel resistance of transistors 215-217. As similarly described with respect to FIG. 1, the body bias circuits 218-220 may increase or decrease the respective threshold voltages $V_{TH}$ of transistors 215-217 according to the input signal strength, and may maintain a relatively constant $V_{GS}$-$V_{TH}$ voltage difference of respective transistors 215-217. As such, the channel resistance of respective transistors 215-217 may be relatively constant, as may be the gain of variable attenuator 200 compared to a conventional variable attenuator, according to an example embodiment of the invention.

FIG. 3A illustrates another variation of an example variable attenuator 300 with an example bootstrapping body bias network 301. In FIG. 3A, transistors 311-317 may substantially similar to transistors 211-217 of FIG. 2A. Likewise, transistors 311-317 may be configured or arranged in a substantially similar manner as transistors 211-217 of FIG. 2A. However, a difference is the manner in which bootstrapping body bias circuits 318, 319, 320 are configured or arranged. In particular, unlike circuits 218, 219, 220 of FIG. 2A, the bootstrapping body bias circuits 318, 319 and 320 of FIG. 3A may be connected in series from the input terminal ($V_{IN}$), which also is the drain of transistor 315, to the body terminal of transistor 317. The network of bootstrapping body bias circuits 318, 319, and 320 may be referred to as a bootstrapping body bias network 301, according to an example embodiment of the invention. In addition, the intersection of circuits 318 and 319 may be connected to the body terminal of transistor 315 while the intersection of circuits 319 and 320 may be connected to the body terminal of transistor 316.

As illustrated in FIG. 3B, each of bias circuits 318-320 may comprise one or more of a resistor 330, an inductor 335, or a capacitor 340. During the operation of the variable attenuator 300, an input RF signal is fed to the input terminal ($V_{IN}$) of the variable attenuator 300. The body bias network 301 may be operative to increase or decrease the amplitude of voltage swing at the body terminals of transistors 315-317 with a corresponding increase or decrease in the RF input signal. However, when the channel resistance of transistor 315 is larger than the series impedance of body bias circuits 318 and 319, then the voltage swing amplitude at the body terminal of the transistor 316 may be larger than the voltage amplitude at the drain terminal of transistor 316. Accordingly, the source-to-body voltage $V_{SB}$ swing of transistors 316 and 317 may have amplitudes which are no less or even higher than the amplitudes of the drain terminals of transistors 316 and 317, respectively, without adding any active circuits that consume power, and the threshold voltage $V_{TH}$ can more closely track the gate-to-source voltage $V_{GS}$ variation due to input signal in order to suppress the channel resistance variations.

Two particular examples will now be illustrated to describe the operations of attenuator 300 with bootstrapping body bias network 301 at a respective higher attenuation setting and at a respective lower attenuation setting. First, at the higher attenuation settings of variable attenuator 300, the channel resistance of transistors 315-317 may set to be high, and hence the gate control voltages $V_{15}$-$V_{17}$ may set to be comparatively closer to the threshold voltage $V_{TH}$ of transistors 315-317. As a result, the $V_{GS}$-$V_{TH}$ voltage difference of transistors 315-317 may be relatively small. An input RF signal may be coupled to the gate terminal of transistors 315-317, thereby causing voltage swings at the gate terminals. The absolute value of amplitude of the gate voltage swings on transistors 315-317 may be comparable to the magnitude of the $V_{GS}$-$V_{TH}$ voltage difference of transistors 315-317; as a result, the variation of the channel resistance of transistors 315-317, which is controlled by the $V_{GS}$-$V_{TH}$ voltage difference, may be large, perhaps as much as tenth of percents of the original value, according to an example embodiment of the invention. A large body voltage swing at the body that bootstrapped the $V_{SB}$ swings generated by the bias network 301 may enforce the threshold voltage $V_{TH}$ of transistors 315-317 to change adaptively according to the input signal, thereby providing for a better gain linearity, according to an example embodiment of the invention.

On the other hand, at the lower attenuation settings of variable attenuator circuit 300, the channel resistance of transistors 315-317 may set to be low, and as such, the gate control voltages $V_{15}$-$V_{17}$ may set to be much higher than the threshold voltage $V_{TH}$ of transistors 315-317. As a result, the $V_{GS}$-$V_{TH}$ voltage difference of transistors 315-317 may be relatively larger than those of higher attenuation settings. Similar to higher attenuation setting example described above, a RF input signal may be coupled to the gate terminals of transistors 315-317 and force them to have voltage swings at the gate terminals. However, the $V_{GS}$-$V_{TH}$ voltage differences of transistors 315-317 may be relatively higher to those in the higher attenuation setting. Accordingly, the ratio of the amplitude of the voltage swings of each gate-to-source voltage $V_{GS}$ of transistors 315-317, to the amplitude of the original gate-to-source $V_{GS}$ voltage at no RF signal input may be comparably smaller than the case of higher attenuation setting, and the channel resistance variations over a whole signal cycle of a RF input are also comparably smaller than the case of higher attenuation setting. Hence, the required $V_{TH}$ swing level that is sufficient to compensate the channel resistance variations of transistors 315-317 may be lower than the case of higher attenuation setting, according to an example embodiment of the invention. Excessively higher levels of body voltage amplitude may over-compensate the resistance variation and worsen the non-linearity. Since the impedance of bootstrapping body bias network 301 is fixed and its magnitude is of a similar amount to the channel resistance of transistors 315-317, when transistors 315-317 are in the high attenuation setting, the bootstrapping body bias network 301 may have an impedance larger than the channel resistance of transistors 315-317 in the low attenuation setting, and may only generate appropriately small voltage swing on the body of transistors 315-317. The small voltage swing may properly compensate the channel resistance variation of transistors 315-317 at low attenuation settings, according to an example embodiment of the invention.

FIG. 4A illustrates a variation of an example variable attenuator 400 in which an example bootstrapping body bias network 401 includes tunable elements or components. In FIG. 4A, transistors 411-417 may be substantially similar to transistors 311-317 of FIG. 3A. Likewise, transistors 411-417 may be configured or arranged in a substantially similar manner as transistors 311-317 of FIG. 3A. Furthermore, the bootstrapping body bias network 401 may be arranged in substantially similar manner as the body bias network 301 in FIG. 3A. However, one or more of the body bias circuits 418, 419, 420 in network 401 may comprise tunable elements or components having associated impedances or resistances that can be varied in accordance with an example embodiment of the invention.

For example, as illustrated in FIG. 4B, each of bootstrapping body bias circuits 418, 419, and 420 may be comprised of at least one transistor 430, which may be a field effect transistor (FET) in accordance with an example embodiment of the invention. The drain and source terminals of the transistor 430 may serve as the two nodes of the bootstrapping body bias circuits 418, 419, and 420. The gate terminal of a transistor 430 may be connected to a control voltage that sets the resistance (e.g., channel resistance) between the drain and source terminals of the transistor 430 used for a bootstrapping body bias circuit 418, 419, or 420.

Still referring to FIG. 4A, the bootstrapping body bias network 401 may be operative to adaptively provide different levels of bootstrapping body voltage bias to one or more of transistors 415, 416, or 417. Compared to network 301 of FIG. 3A, the bootstrapping body bias network 401 can be configured to generate a smaller body voltage amplitude at lower attenuation settings, and may generate larger body voltage amplitude at higher attenuation settings, according to example embodiment of the invention. To do so, the impedance of bootstrapping body bias circuits 418, 419, and 420 can be adjusted to have a larger resistance or impedance at lower power settings, and a smaller resistance or impedance at higher power settings. Accordingly, the body bias network 401 may body bootstrap the signal swing at different attenuation settings, according to an example embodiment of the invention. As a result, the threshold voltage $V_{TH}$ variations of transistors 414-417 of FIG. 4A may be larger than that for transistors 314-317 during attenuator operation at high attenuation settings. On the other hand, the threshold voltage $V_{TH}$ variations of transistors 414-417 of FIG. 4A may be smaller than that for transistors 314-317 of FIG. 3A during attenuator operation at low attenuation settings. The channel resistance of transistors 414-417 may therefore be much well compensated at higher attenuation settings, and may reduce the possibility to be over-compensated at lower attenuation settings.

A control signal for a tunable bootstrapping bias circuit 418, 419, 420 in FIG. 4A may be generated from one or more control circuits that a output higher voltage at high attenuation settings and a lower voltage at lower attenuation settings. Where the body bias circuit 418, 419, 420 is a FET, the gate terminal of the bias circuit 418, 419, 420 may be commonly connected to voltages $V_{11}, V_{12}, V_{13},$ and $V_{14}$, or alternatively, may each be connected to one of voltages $V_{11}$ to $V_{14}$. Indeed, because voltages $V_{11}$ to $V_{14}$ are used to control shunt transistors 411-414 to ground, the channel resistance of transistors 411-414 are required to be high in lower attenuation settings and to be low in high attenuation settings, which may generally correspond the resistances or impedances required for tunable bias networks 418-420. It should be appreciate that while example embodiments of the invention in FIGS. 4A and 4B illustrates FETs as tunable components, bipolar junction transistors (BJTs) may equally be utilized for the tunable body bias circuits 418, 419, 420 without departing from example embodiments of the invention. As an example, FETs may have respective gates, sources, and drains while BJTs may have respective bases, emitters, and collectors. Thus any gate, source or drain of a FET in the tunable bootstrapping bias network 401 discussed herein could likewise be substituted with a corresponding base, emitter or collector of a BJT, according to an example embodiment of the invention.

It will be appreciated that while the operations of tunable body bias circuits 418, 419, 420 have been discussed in accordance with a series-connected body bias network 401, it can similarly be applied to the body bias circuit of FIG. 1, or the body bias circuits 218, 219, 220 of FIG. 2A without departing from example embodiments of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A variable attenuator, comprising:
   at least one series transistor, including a first series transistor, provided in main signal path between an input terminal and an output terminal, the input terminal for receiving a RF input signal and the output terminal for outputting an attenuated RF output signal, wherein the first series transistor includes at least a first drain terminal, a first source terminal, and a first body terminal, wherein the first drain terminal and the first source terminal are part of the main signal path;
   at least one first shunt transistor connected between the input terminal and ground;
   at least one second shunt transistor connected between the output terminal and ground;
   at least one bootstrapping body bias circuit, including a first bootstrapping body bias circuit to connect either the first drain terminal or the first source terminal to the first body terminal, wherein each bootstrapping body bias circuit is associated with a respective resistance or impedance.

2. The variable attenuator of claim 1, wherein each bootstrapping body bias circuit includes at least one of: (i) an inductor, (ii) a capacitor, or (iii) a resistor.

3. The variable attenuator of claim 1, wherein the first bootstrapping body bias circuit is operative to couple at least a portion of the received RF input signal from the first drain terminal or first source terminal to the first body terminal.

4. The variable attenuator of claim 1,
   wherein the at least one first shunt transistor includes at least a second drain terminal and a second source terminal, wherein the second drain terminal is connected to the input terminal, and the second source terminal is connected to ground, and
   wherein the at least one second shunt transistor includes at least a third drain terminal and a third source terminal, wherein the third drain terminal is connected to the output terminal, and the third source terminal is connected to ground.

5. The variable attenuator of claim 1, wherein the at least one series transistor further includes a second series transistor having a second drain terminal, a second source terminal, and a second body terminal, wherein the first drain terminal is connected to the input terminal, the first source terminal is connected to the second drain terminal, and the second source terminal is connected to either the output terminal or a third drain of a third series transistor of the at least one series transistor, and further comprising:
   at least one third shunt transistor connected between an intersection of the first source terminal and the second drain terminal and ground; and
   a second bootstrapping body bias circuit to connect the second body substrate to either (i) the second drain terminal or the second source terminal, or (ii) the first bootstrapping body bias circuit.

6. The variable attenuator of claim 1, wherein the at least one series transistor, the at least one first shunt transistor, and the at least one second shunt transistor includes a respective gate terminal for receiving a respective control voltage to adjust a respective resistance of the respective series transistor, first shunt transistor, and second shunt transistor.

7. The variable attenuator of claim 1, wherein during a low attenuation setting, the respective control signals of the at least one first and second shunt transistors are set to a first low voltage, and the respective control signal of the at least one series transistor is set to a first high voltage; and wherein during a high attenuation setting, the respective control signals of the at least one first and second shunt transistors are set to a second high voltage, and the respective control signal of the at least one series transistor is set to a second low voltage.

8. The variable attenuator of claim 1, wherein each bootstrapping body bias circuit includes a variable resistance element, wherein a respective resistance or impedance of the variable resistance element is adjustable based upon a control signal provided to the variable resistance element.

9. The variable attenuator of claim 8, wherein the variable resistance element is a transistor.

10. The variable attenuator of claim 9, wherein the transistor is a field effect transistor (FET) or a bipolar junction transistor (BJT).

11. A method for a variable attenuator, comprising:
providing at least one series transistor, including a first series transistor, along a main signal path between an input terminal and an output terminal, the input terminal for receiving a RF input signal and the output terminal for outputting an attenuated RF output signal, wherein the first series transistor includes at least a first drain terminal, a first source terminal, and a first body terminal, wherein the first drain terminal and the first source terminal are part of the main signal path;
connecting at least one first shunt transistor between the input terminal and ground;
connecting at least one second shunt transistor between the output terminal and ground; and
providing at least one bootstrapping body bias circuit, including a first bootstrapping body bias circuit to connect either the first drain terminal or the first source terminal to the first body terminal, wherein each bootstrapping body bias circuit is associated with a respective resistance or impedance.

12. The method of claim 11, wherein each bootstrapping body bias circuit includes at least one of: (i) an inductor, (ii) a capacitor, or (iii) a resistor.

13. The method of claim 11, wherein the first bootstrapping body bias circuit is operative to couple at least a portion of the received RF input signal from the first drain terminal or first source terminal to the first body terminal.

14. The method of claim 11,
wherein the at least one first shunt transistor includes at least a second drain terminal and a second source terminal, wherein the second drain terminal is connected to the input terminal, and the second source terminal is connected to ground, and
wherein the at least one second shunt transistor includes at least a third drain terminal and a third source terminal, wherein the third drain terminal is connected to the output terminal, and the third source terminal is connected to ground.

15. The method of claim 11, wherein the at least one series transistor further includes a second series transistor having a second drain terminal, a second source terminal, and a second body terminal, wherein the first drain terminal is connected to the input terminal, the first source terminal is connected to the second drain terminal, and the second source terminal is connected to either the output terminal or a third drain of a third series transistor of the at least one series transistor, and further comprising:
connecting at least one third shunt transistor between an intersection of the first source terminal and the second drain terminal and ground; and
providing a second bootstrapping body bias circuit to connect the second body substrate to either (i) the second drain terminal or the second source terminal, or (ii) the first bootstrapping body bias circuit.

16. The method of claim 11, wherein the at least one series transistor, the at least one first shunt transistor, and the at least one second shunt transistor includes a respective gate terminal for receiving a respective control voltage to adjust a respective resistance of the respective series transistor, first shunt transistor, and second shunt transistor.

17. The method of claim 11, wherein during a low attenuation setting, the respective control signals of the at least one first and second shunt transistors are set to a first low voltage, and the respective control signal of the at least one series transistor is set to a first high voltage; and wherein during a high attenuation setting, the respective control signals of the at least one first and second shunt transistors are set to a second high voltage, and the respective control signal of the at least one series transistor is set to a second low voltage.

18. The method of claim 11, wherein each bootstrapping body bias circuit includes a variable resistance element, wherein a respective resistance or impedance of the variable resistance element is adjustable based upon a control signal provided to the variable resistance element.

19. The method of claim 18, wherein the variable resistance element is a transistor.

20. The method of claim 19, wherein the transistor is a field effect transistor (FET) or a bipolar junction transistor (BJT).

* * * * *